United States Patent
Chow

(10) Patent No.: US 6,784,819 B2
(45) Date of Patent: Aug. 31, 2004

(54) MEASURING SKEW BETWEEN DIGITIZER CHANNELS USING FOURIER TRANSFORM

(75) Inventor: Ka Ho Colin Chow, Brighton, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/185,956

(22) Filed: Jun. 27, 2002

(65) Prior Publication Data

US 2004/0001017 A1 Jan. 1, 2004

(51) Int. Cl.[7] .............................................. H03M 1/12
(52) U.S. Cl. ...................... 341/155; 341/118; 341/120; 324/532; 324/535; 324/617
(58) Field of Search ................................. 341/118, 120, 341/155; 324/532, 535, 617

(56) References Cited

U.S. PATENT DOCUMENTS

| | | | | |
|---|---|---|---|---|
| 4,736,189 A | * | 4/1988 | Katsumata et al. | 341/120 |
| 4,763,105 A | * | 8/1988 | Jenq | 341/120 |
| 4,858,142 A | * | 8/1989 | Jenq et al. | 702/71 |
| 4,968,988 A | * | 11/1990 | Miki et al. | 341/141 |
| 5,159,337 A | * | 10/1992 | Lankreijer | 341/67 |
| 5,239,299 A | * | 8/1993 | Apple et al. | 341/118 |
| 5,294,926 A | * | 3/1994 | Corcoran | 341/120 |
| 6,269,317 B1 | * | 7/2001 | Schachner et al. | 702/91 |
| 6,384,756 B1 | * | 5/2002 | Tajiri et al. | 341/120 |
| 6,522,282 B1 | * | 2/2003 | Elbornsson | 341/155 |
| 6,556,156 B1 | * | 4/2003 | Hungerbuehler | 341/120 |

OTHER PUBLICATIONS

S. Gori and C. Narduzzi, Application of a Phase Measurement Algorithm to Digitizing Oscilloscope Characterization, 1999.

* cited by examiner

Primary Examiner—Michael Tokar
Assistant Examiner—Khai Nguyen
(74) Attorney, Agent, or Firm—Bruce D. Rubenstein; Teradyne Legal Department

(57) ABSTRACT

A technique for deskewing digitizer channels in an automatic test system includes applying a waveform of known frequency to the input of each digitizer channel. Each digitizer channel samples the waveform to produce a respective data record. A Discrete Fourier Transform (DFT), or a portion thereof, is then taken for each data record to determine, at minimum, the phase of the waveform. Phase differences across different digitizer channels are converted to time differences, which values are applied to subsequent digitizer measurements to correct for timing skew. Because a large number of samples in a digitizer's data record contribute to the computed phase of the waveform, the effects of timing jitter are substantially eliminated from skew measurements, without the need for repeating measurements and explicitly averaging results.

21 Claims, 2 Drawing Sheets

# MEASURING SKEW BETWEEN DIGITIZER CHANNELS USING FOURIER TRANSFORM

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to automatic test equipment for electronics ("ATE"), and, more particularly, to processes for deskewing digitizer channels that are used to capture waveforms in ATE systems.

2. Description of Related Art

Manufacturers of semiconductor devices commonly use ATE, or "testers," to test whether devices meet their requirements. Testing devices early in the manufacturing process allows devices that fail their tests to be discarded before additional manufacturing costs are incurred. In addition, sorting devices into different categories based on test results allows manufacturers to sell devices having different performance at different prices.

Testers generally come equipped with instruments called "digitizers" for capturing signals from devices under test (DUTs). Digitizers include hardware for sampling analog signals and converting them to digital records. These records can then be analyzed and tested using a test system computer. Many testers include built-in digitizers, which communicate with the test system computer via an internal (and generally proprietary) instrument bus. Testers can also employ external digitizers, which communicate via an industry standard bus, such as IEEE-488 or VXI.

When different digitizers are used, or, equivalently, when different channels of one or more digitizers are used, a need arises to align these digitizer channels in time. Consider a case in which a first digitizer channel samples the input to a DUT and a second digitizer channel samples the output. If one wishes to measure the DUT's propagation delay, it is first necessary to know the difference in delay (i.e., "timing skew") inherent between the first and second digitizer channels and their associated cabling. Only when this difference is known can an accurate value of propagation delay be reported. Timing skew originates from many sources, which include differences in electrical paths leading up to the digitizer channels, differences in characteristic impedance of the paths, and differences in electrical propagation delays within the digitizer channels themselves.

FIG. 1 shows a prior technique for determining timing skew between two digitizer channels. At step 110, a waveform conveying an edge or other electrical event is applied to the inputs of the digitizer channels simultaneously (e.g., using matched length cables and a power splitter). The digitizer channels are each made to capture the waveform (step 112). The tester then examines the data records associated with the digitizer channels to determine the locations of the edge within the records (step 114). The difference between these locations (determined at step 116) corresponds to the timing skew. This value can then be subtracted from any time measurement taken between these digitizer channels to yield a measurement that is corrected for timing skew.

This prior technique is extremely effective; however, it requires averaging before its best accuracy can be attained. Jitter, i.e., timing noise, in the digitizers' circuitry and in the paths leading to the digitizer channels, gives rise to errors in the measurement of timing skew. Repeating the skew measurement and averaging the results (steps 118 and 120) can substantially reduce these errors. These steps require additional time, however. This prior technique only considers samples in the vicinity of the edge in computing the timing skew. Therefore, many repetitions of the edge are required to substantially reduce the jitter. In addition, each edge must be found by searching the digitizer's data record for the expected level transition. The time needed to perform these functions negatively impacts tester performance.

Another prior technique for determining timing skew has been to use a TDR (Time Domain Reflectometer) to measure delays in the paths leading up to the digitizer channels. According to this technique, an instrument sends a pulse down a line leading to a digitizer channel and measures the time it takes for the pulse to reflect from the end of the line and return to the source. The delay of the line is then computed as one-half the round-trip transit time of the pulse. This measurement is repeated for each digitizer channel, and skew between the channels is computed.

The TDR technique can accurately measure path delays, but it cannot measure internal delays, such as propagation delays within the digitizer circuitry itself. Circuit delays can represent a significant portion of overall skew, and failing to remove them can yield unsatisfactory results.

What is needed is a deskewing technique that is fast, accurate, and accounts for all the significant sources of skew.

BRIEF SUMMARY OF THE INVENTION

With the foregoing background in mind, it is an object of the invention accurately and quickly to eliminate timing skew between digitizer channels of an automatic test system.

To achieve the foregoing object, as well as other objectives and advantages, a waveform is applied to the input of each of a plurality of digitizer channels. Each digitizer channel samples the waveform to produce a respective data record. A Discrete Fourier Transform (DFT), or a portion thereof, is then taken for each data record to determine, at minimum, the phase of the waveform. Phase differences between different digitizer channels are converted to time differences, which are applied to subsequent measurements to correct for the effects of timing skew.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Figure 2:
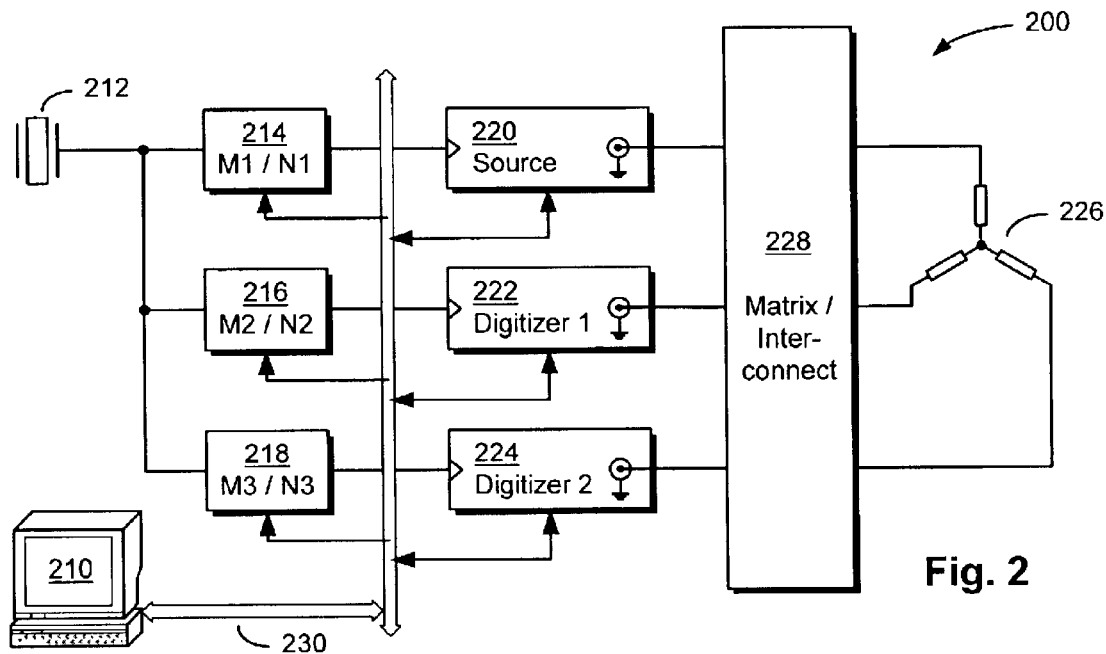
FIG. 2 is a simplified schematic of a portion of an ATE system arranged to acquire data in parallel for deskewing digitizer channels according to the invention.

The principles of the invention may be applied in connection with a portion of an automatic test system 200, shown generally in FIG. 2. The automatic test system 200 includes a host computer 210 for calibrating the test system 200 and testing devices using tester software. The host computer communicates via a control bus 230 with test instruments, such as a waveform source 220, a first digitizer 222, and a second digitizer 224. The waveform source is preferably an arbitrary waveform generator. The output of the source and inputs of the digitizers are conveyed to an area at or near the DUT via a Matrix/Interconnect 228.

A master clock 212 controls the sampling rate of the instruments 220, 222, and 224 via respective frequency dividers 214, 216, and 218. The frequency dividers each provide an output frequency that is M/N times their input frequency, where M and N are integers (depending on the values of M and N, the frequency "dividers" can instead be multipliers). In general, the frequency of the clock signal inputted to each instrument equals the sampling rate of the instrument. Therefore, by varying the values of M and N for the frequency dividers 214, 216, and 218, the tester can source and capture waveforms with a great deal of timing flexibility.

Figure 1:
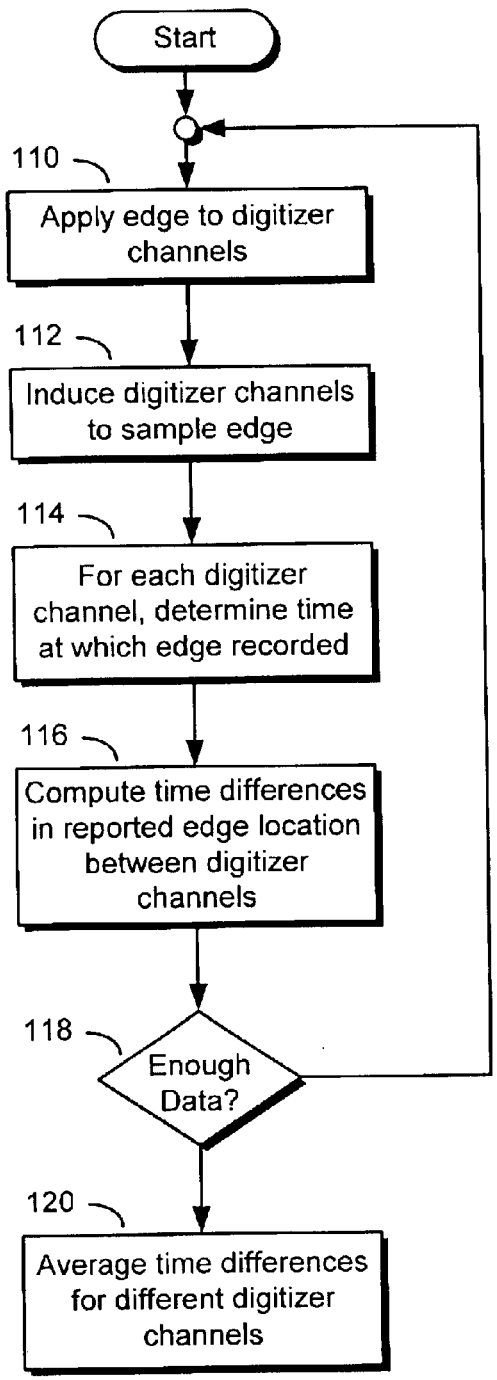
FIG. 1 is a flowchart of a conventional process for deskewing digitizer channels in an ATE system.
Figure 4:
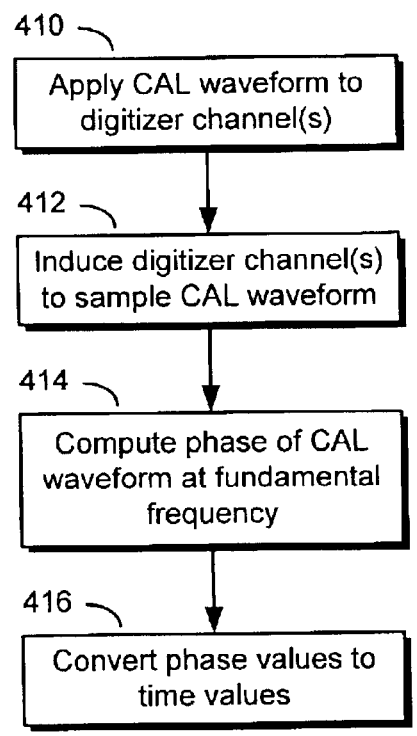
FIG. 4 is a flowchart of a process according to the invention for deskewing digitizer channels in an ATE system.

Referring now also to the flowchart shown in FIG. 4, the automatic test system 200 eliminates timing skew between the first and second digitizers 222 and 224 as follows. At step 410, the host computer 210 programs the waveform source 220 to generate a calibration waveform, preferably a sine wave, of known frequency. The frequency is preferably low enough so that its associated period (1/Frequency) exceeds the maximum expected skew, but preferably high enough to achieve the desired timing resolution. The calibration waveform is preferably conveyed to the area at or near the DUT via the Matrix/Interconnect 228. A power splitter 226 divides the output of the source 220 into two paths: a first path coupled to the first digitizer 222 and a second path coupled to the second digitizer 224 (again, via the Matrix/Interconnect 228). Delays through the power splitter 226 and the cables connecting the power splitter to the Matrix/Interconnect 228 are preferably known in advance, so that any skew associated with their use can be prevented from affecting calibration accuracy.

At step 412, the first and second digitizers are simultaneously caused to sample the calibration waveform. The first and second digitizers 222 and 224 each capture the calibration waveform and store their samples in a data record within a memory. Preferably, the first and second digitizers 222 and 224 capture the calibration waveform at the same sampling rate and capture the same number of samples.

Once the samples are acquired, the host computer 210 reads each data record and computes a Discrete Fourier Transform (DFT) thereupon (step 414). The host computer 210 then extracts the component of the DFT corresponding to the phase of the calibration waveform at its fundamental frequency.

At step 416, the host computer converts the phase ($\phi_i$) reported from each $i^{th}$ data record to a time ($t_i$), by applying the equation $t_i=\phi_i/2\pi F$, where F is the frequency of the fundamental. The phase difference $\phi_2-\phi_1$ between the two digitizers can similarly be converted to time differences using the equation $\Delta t=\Delta\phi/2\pi F$, where $\Delta t$ is the timing skew, $t_2-t_1$, between the two digitizers.

The values of $t_i$ (or, alternatively, the value of $\Delta t$) are stored for later access by the automatic test system. When both digitizers are involved in a measurement that requires that their timing be deskewed, the values of $t_i$ (or the value of $\Delta t$) can be read back by the automatic test system and applied. In particular, $\Delta t$ can be subtracted from time measurements to correct them for skew.

The precision of the above-described technique depends upon the DFT providing an accurate measure of the fundamental's phase. To promote this precision, the calibration waveform should preferably have low close-in phase noise near its fundamental frequency. As is known, DFT's divide the spectra of waveforms into regularly spaced frequency bins. Best phase accuracy is achieved when no significant phase noise falls within the same frequency bin in which the fundamental appears. Conversely, precision does not depend substantially on the phase noise in other frequency bins. Therefore, the overall phase noise of the calibration waveform need not be low, provided that phase noise is relatively low in the frequency bin in which the fundamental appears.

Another way of promoting precision is to reduce or eliminate spectral leakage from the DFT. As is known, spectral leakage appears in a DFT when each frequency component of the sampled waveform completes something other than an exact integer number of cycles within the sample window. In the preferred embodiment, the digitizers are made to sample the calibration waveform "coherently," i.e., over a window that corresponds to an exact integer number of cycles of the calibration waveform. The test system accomplishes coherent sampling through appropriate settings of the length of the sampling window and the integers M and N of the frequency dividers 214, 216, and 218.

It is apparent from the foregoing description that only the frequency bin of the fundamental is relevant to the deskewing process. For these purposes, therefore, data from all other frequency bins can be safely discarded. Speed is an important consideration in calibration measurements. Therefore, the preferred embodiment preferably avoids executing a full DFT and computes only the phase in the fundamental's frequency bin. This shortcut significantly reduces computational overhead.

The above-described technique promotes speed and avoids the need for averaging individual delay measurements. We have recognized that the DFT itself can be regarded as an averaging algorithm, wherein each sample contributes to the value of each frequency and phase component. Because it uses every sample in its data record, the DFT can average out jitter with far less waveform data than is required by the previous technique, which only considers samples in the vicinities of the edges. The above-described technique also promotes high speed by making it unnecessary to search for edges in the waveform data.

Alternatives

Having described one embodiment, numerous alternative embodiments or variations can be made. For instance, as described above, two digitizers 222 and 224 are made to sample the calibration waveform simultaneously, via a power splitter 226. This technique is not limited to use with two digitizers, however. As is known, power splitters can be cascaded to allow greater than two digitizers to sample the calibration waveform simultaneously. Other signal dividers, such as coaxial "T" connectors or other devices, could be used in place of power splitters, provided that precautions are taken to prevent signal reflections from unfavorably affecting measurement results.

Figure 3:
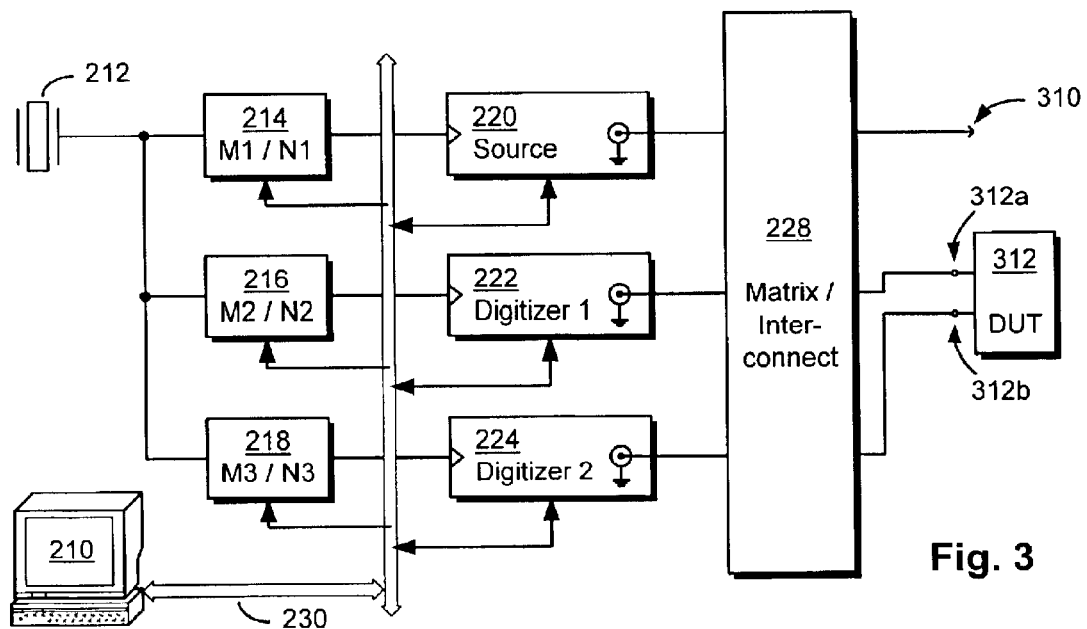
FIG. 3 is alternative simplified schematic of a portion of an ATE system arranged to acquire data in series for deskewing digitizer channels.

Measurements for deskewing digitizers can also be made one at a time. As shown in FIG. 3, the output of the source 220 can be conveyed to a source node 310, and then applied in sequence to nodes 312a and 312b of a DUT 312, which are connected to the digitizers via the Matrix/Interconnect 228. First, the source node 310 is connected to the first node 312a of the DUT and the process shown in FIG. 4 is performed. Then, the source node 310 is connected to the second node 312b of the DUT and the process of FIG. 4 is repeated. The DUT 312 may be removed during the measurement, or left installed if its loading characteristics do not deleteriously affect the measurement results.

Measuring the calibration waveform one at a time makes it possible that the digitizers will not begin sampling at the same phase of the calibration waveform. They should preferably begin sampling at the same phase to ensure that any measured phase differences are wholly attributable to skew. As indicated above, the sampling rates of the source 220 and the digitizers are generally derived from the same clock. To ensure that the phase of the calibration waveform is the same for both captures, one can simply start the second capture an integer number of sampling windows after starting the first capture, wherein a "sampling window" is the length of time over which each digitizer samples. It is apparent that this variation is easily extendable to any number of digitizers.

As described above, the calibration waveform is preferably a sine wave. This need not be the case, however. The calibration waveform can assume virtually any other waveform shape, such as a square wave, triangle wave, and so forth. When waveforms other than a sine wave are used, one must take precautions to prevent high frequencies from aliasing back into the fundamental's frequency bin, as these frequencies can distort the phase measurement at the fundamental. Aliasing can be prevented by band limiting (i.e., low-pass filtering) the inputs to the digitizers. Any filters used for this purpose should have similar characteristics, to prevent then from differentially delaying the fundamental. Better still, the same anti-aliasing filter should be used for all digitizers.

A particularly interesting possibility is to generate the calibration waveform using a digital driver circuit. Digital driver circuits are commonly provided in large numbers within ATE systems. These circuits are generally synchronized to the same master clock as the digitizers, and provide an easy alternative to using an arbitrary waveform generator.

Where waveforms other than sine waves are used, it is possible that skew can be measured using a harmonic of the calibration waveform, rather than of the fundamental. Deskewing with the phase of a harmonic is possible, but measurements will usually be less accurate than when the fundamental is used, because the harmonic's magnitude is generally much smaller than the fundamental's.

The above-described technique is illustrated with an example of a test system having two digitizer instruments. However, any number of digitizers can be deskewed using the techniques described. The digitizers can be built-in to the tester or can be separate. In addition, it is often efficient for ATE systems to provide digitizer instruments with multiple channels. Each channel of a digitizer may have its own dedicated memory for storing samples, or may share a common memory provided for the entire instrument. These channels can be deskewed according to the invention the same way as separate digitizer instruments. It should be understood, therefore, that the term "digitizer channels," as used herein, is meant to include a wide range of configurations, including different channels of a single instrument, different channels of different instruments, and different instruments altogether.

As described herein, a single computer controls the instruments to obtain deskewing data and then applies calibration data to correct actual measurements. The invention is not limited to use with a single computer, however. Testers often include multiple computers, and different portions of the process can be executed by different computers.

While the invention has been particularly shown and described with reference to the preferred embodiments thereof, it will be understood by those skilled in the art that various changes in form and detail may be made therein without departing from the spirit and scope of the invention.

What is claimed is:

1. A method for reducing timing skew from measurements made between digitizer channels in an automatic test system, comprising:
    sampling a waveform with each digitizer channel to produce a respective data record;
    calculating a phase value of the waveform from each data record;
    converting the phase values to time values; and
    applying the time values to measurements made between digitizer channels to correct for the effects of timing skew.

2. A method as recited in claim 1, further comprising applying the waveform to at least one of the plurality of digitizer channels by activating a waveform source.

3. A method as recited in claim 2, wherein the waveform source and each of the digitizer channels have respective sampling rates and sample over respective intervals, and the sampling rates and sampling intervals of the waveform source and the digitizer channels are established to sample the waveform coherently.

4. A method as recited in claim 1, wherein the waveform is a sine wave.

5. A method as recited in claim 4, wherein the sine wave is produced by an arbitrary waveform generator.

6. A method as recited in claim 1, wherein the waveform is a rectangular waveform.

7. A method as recited in claim 6, wherein the rectangular waveform is produced by a digital driver in the automatic test system.

8. A method as recited in claim 2, wherein
    the step of applying the waveform includes splitting the waveform into at least two parts and providing the parts to at least two of the plurality of digitizer channels simultaneously; and
    the step of sampling includes the at least two digitizer channels sampling the waveform simultaneously.

9. A method as recited in claim 2, wherein
    the step of applying the waveform includes applying the waveform to one digitizer channel at a time; and
    the step of sampling includes sampling the waveform by each digitizer channel one at a time.

10. An apparatus for reducing timing skew from time measurements made between digitizer channels in an automatic test system, comprising:
    means for sampling a waveform with each digitizer channel to produce a respective data record;
    means for calculating a phase value of the waveform from each data record;
    means for converting the phase values to time values; and
    means for applying the time values to time measurements made between digitizer channels to correct for the effects of timing skew.

11. An apparatus for capturing waveforms in an automatic test system, comprising:
    first and second digitizer channels each including sampling hardware for sampling a waveform and having access to a memory for storing respective data records;

a computer processor for calculating phase values from waveform data stored in the memory for each of the first and second digitizer channels and converting the phase values to time values; and software for applying the time values to measurements made between the first and second digitizer channels to correct for the effects of timing skew.

12. An apparatus as recited in claim 11, wherein the first and second digitizer channels are part of a single digitizer instrument.

13. An apparatus as recited in claim 12, wherein the digitizer instrument includes a single memory for storing waveform data, and wherein waveform data from the first digitizer channel is stored at a first location in the memory and waveform data from the second digitizer channel is stored at a second location in the memory.

14. An apparatus as recited in claim 11, wherein the first and second digitizer channels are associated with separate digitizer instruments.

15. A method of manufacturing an integrated circuit, comprising:

fabricating a circuit on a semiconductor wafer; and testing the circuit, including measuring at least one time interval between a first electrical event, using a first digitizer channel, and a second electrical event, using a second digitizer channel, wherein the first and second digitizer channels are deskewed by a process that includes sampling a waveform having a known frequency with the first and second digitizer channels to produce respective data records;

calculating a phase value of the waveform from each data record;

converting the phase values to time values; and applying the time values to time measurements to correct the time measurements for the effects of timing skew.

16. A method as recited in claim 15, further comprising one of generating a passing test result responsive to the measured time interval being within allowable test limits; and generating a failing test result responsive to the measured time interval being outside allowable test limits.

17. An automatic test system, comprising:

a waveform source;

a plurality of digitizer channels;

an interconnect for conveying an output of the waveform source and an input of each of the plurality of digitizer channels to nodes of a device under test; and software for reducing timing skew between different ones of the plurality of digitizer channels, said software performing the steps of causing the waveform source to generate a calibration signal;

configuring the interconnect to couple the output of the waveform source to the input of at least one of the plurality of digitizer channels;

causing said at least one of the plurality of digitizer channels to sample the calibration signal to produce a respective data record;

calculating a phase value of the calibration signal from each data record;

converting the phase values to time values; and storing the time values so that they can be later applied to measurements between digitizer channels to correct for timing skew.

18. The automatic test system as recited in claim 17, further comprising a signal divider coupled to the output of the waveform source for simultaneously providing the calibration signal to two or more of the plurality of digitizer channels at a time, for sampling the calibration signal in parallel.

19. The automatic test system as recited in claim 17, wherein the software causes the calibration signal to be applied to the plurality of digitizer channels one at a time, so that the data record for each digitizer channel represents the calibration signal at a different period of time.

20. The automatic test system as recited in claim 17, further comprising:

a master clock, wherein the waveform source and the plurality of digitizer channels each have at least one clock input coupled to the master clock.

21. A method of making measurements between digitizer channels in an automatic test system, comprising:

sampling a waveform with first and second digitizer channels to produce first and second data records;

calculating a skew correction from the first and second data records;

capturing a first signal with the first digitizer channel and a second signal with the second digitizer channel;

making a time measurement between the first and second captured signals; and applying the skew correction to the time measurement to enhance its accuracy.

* * * * *